United States Patent
Lee et al.

(10) Patent No.: US 7,678,535 B2
(45) Date of Patent: Mar. 16, 2010

(54) METHOD FOR FABRICATING SEMICONDUCTOR DEVICE WITH RECESS GATE

(75) Inventors: Jung-Seock Lee, Ichon-shi (KR); Ky-Hyun Han, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 662 days.

(21) Appl. No.: 11/477,867

(22) Filed: Jun. 30, 2006

(65) Prior Publication Data

US 2007/0105388 A1    May 10, 2007

(30) Foreign Application Priority Data

Nov. 10, 2005   (KR) ...................... 10-2005-0107401

(51) Int. Cl.
*H01L 29/812* (2006.01)
*H01L 21/336* (2006.01)

(52) U.S. Cl. ................. 430/314; 430/323; 430/324; 438/695; 438/696; 438/270; 438/259; 257/E29.321

(58) Field of Classification Search .................. None
See application file for complete search history.

(56) References Cited

U.S. PATENT DOCUMENTS

| 6,090,668 | A  | * | 7/2000 | Lin et al. .................... 438/266 |
| 2005/0045276 | A1 | * | 3/2005 | Patel et al. ............. 156/345.43 |
| 2006/0049455 | A1 | * | 3/2006 | Jang et al. ................... 257/330 |
| 2007/0148979 | A1 | * | 6/2007 | Lee et al. .................... 438/700 |
| 2007/0170522 | A1 | * | 7/2007 | Lee et al. .................... 257/401 |

* cited by examiner

*Primary Examiner*—Daborah Chacko Davis
(74) *Attorney, Agent, or Firm*—IP & T Law Firm PLLC

(57) ABSTRACT

A method for fabricating a semiconductor device includes forming a mask pattern over a substrate; etching a certain portion of the substrate using the mask pattern as an etch mask to form a first recess having sidewalls; forming a polymer-based layer over the sidewalls of the first recess and a top surface of the mask pattern; etching the substrate beneath the first recess using the mask pattern and the polymer-based layer as an etch mask to form a second recess wider and more rounded than the first recess, the second recess and the first recess constituting a bulb-shaped recess; and forming a gate pattern over the bulb-shaped recess.

15 Claims, 5 Drawing Sheets

H

40          O₁

US 7,678,535 B2

METHOD FOR FABRICATING SEMICONDUCTOR DEVICE WITH RECESS GATE

RELATED APPLICATION

The present application is based upon and claims benefit of priority to Korean patent application No. KR 2005-0107401, filed in the Korean Patent Office on Nov. 10, 2005, the entire contents of which are incorporated herein by reference.

TECHNICAL FIELD

The present invention relates to a method for fabricating a semiconductor device; and more particularly, to a method for fabricating a semiconductor device with a recess gate.

DESCRIPTION OF RELATED ARTS

As for a typical method for forming a planar gate interconnection line by forming a gate over a flat active region, the current large integration scale of semiconductor devices has caused a channel length to be decreased but an implantation doping concentration to be increased. Accordingly, due to an increased electric field, a junction leakage is generated and thus, it becomes difficult to secure a satisfactory refresh property of a device.

A recess gate process forming a gate after etching a substrate defined into an active region into a recess pattern is implemented as a method for forming a gate interconnection line to solve the aforementioned problems. If the recess gate process is used, a channel length can be increased and an implantation doping concentration can be decreased and a refresh property of the device can be improved.

FIGS. 1A and 1B are cross-sectional views illustrating a typical method for fabricating a semiconductor device with a recess gate.

As shown in FIG. 1A, a plurality of device isolation layers 12 defining an active region are formed in certain portions of a substrate 11. A plurality of mask patterns 13 are formed over the device isolation layers 12. Each of the mask patterns 13 is formed by sequentially stacking a pad oxide layer 13A, a hard mask 13B, and a photoresist layer 13C.

As shown in FIG. 1B, predetermined portions of the substrate 11 are etched by using the mask patterns 13 as an etch mask to form a plurality of recesses 14. After the recesses 14 are formed, the mask patterns 13 are removed.

FIG. 2 is a cross-sectional view illustrating a semiconductor device formed by the method illustrated in FIGS. 1A and 1B. As shown in FIG. 2, a horn H is formed at edges of an active region contacting device isolation layers.

FIG. 3 is a micrographic image of a recess profile of the semiconductor device formed by the typical method illustrated in FIGS. 1A and 1B. As shown in FIG. 3, a typical 'U' shaped recess has a channel length of $D_1$ and generates a stress point at a top corner 40.

The typical method provides a longer channel and a better refresh property than a planar gate pattern. However, a pattern needs to be micronized as the size of the semiconductor devices has been decreased, and a distance between the channels needs to be longer as a distance between devices has been decreased.

Furthermore, a horn may be formed at edges of the active region contacting the device isolation layers after the recesses are formed. As a result, electric charges may be localized around the horn and a leakage current may be generated.

SUMMARY

The present invention provides a method for fabricating a semiconductor device with a recess gate lengthening a channel by removing a horn.

A method for fabricating a semiconductor device consistent with embodiments of the present invention includes forming a mask pattern over a substrate; etching a certain portion of the substrate using the mask pattern as an etch mask to form a first recess having sidewalls; forming a polymer-based layer over the sidewalls of the first recess and a top surface of the mask pattern; etching the substrate beneath the first recess using the mask pattern and the polymer-based layer as an etch mask to form a second recess wider and more rounded than the first recess, the second recess and the first recess constituting a bulb-shaped recess; and forming a gate pattern over the bulb-shaped recess.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION

Hereinafter, detailed descriptions on certain embodiments of the present invention will be provided with reference to the accompanying drawings.

FIGS. 4A to 4E are cross-sectional views illustrating a method for fabricating a semiconductor device consistent with an embodiment of the present invention.

Figure 4A:
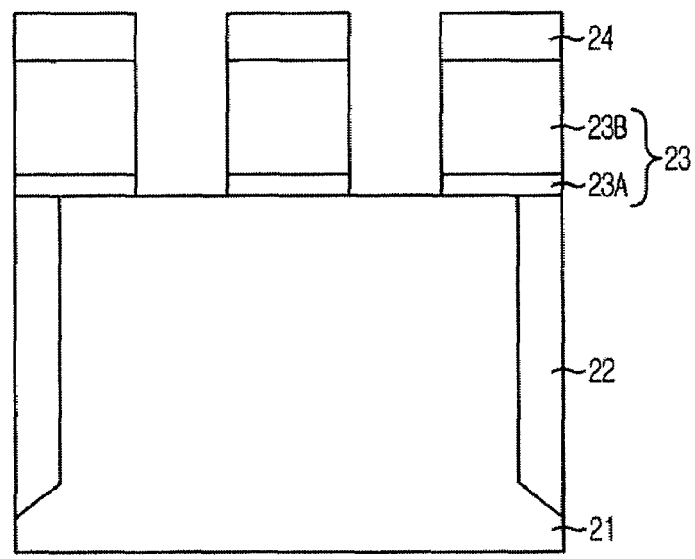
FIGS. 4A to 4E are cross-sectional views illustrating a method for fabricating a semiconductor device consistent with an embodiment of the present invention.

As shown in FIG. 4A, a plurality of device isolation layers 22 are formed in certain portions of a substrate 21 comprising silicon. The device isolation layers 22 are formed to a depth of approximately 3,000 Å or less to define an active region.

In more detail of the formation of the device isolation layers 22, the certain portions of the substrate 21 are etched to form a plurality of trenches. An insulation layer is filled into the trenches and then, subjected to a chemical mechanical polishing (CMP) process.

A patterned photoresist layer 24 and a mask pattern 23 are formed over the substrate 21 including the device isolation layers 22.

Although not shown, processes of forming the patterned photoresist layer 24 and the mask pattern 23 will be explained hereinafter.

A pad oxide layer and a hard mask layer are sequentially formed over the device isolation layers 22. The hard mask layer serves to secure a margin of a photoresist layer during a subsequent etching process on the substrate 21, and the hard mask layer is formed of polysilicon.

The photoresist layer is formed over the hard mask layer. The photoresist layer is patterned by performing a photolithograph process to form the patterned photoresist layer 24.

The hard mask layer and the pad oxide layer are etched using the patterned photoresist layer 24. A patterned hard mask layer and a patterned pad oxide layer are denoted with reference numerals 23B and 23A, respectively. The patterned hard mask layer 23B and the patterned pad oxide layer 23A constitute the mask pattern 23.

Figure 4B:
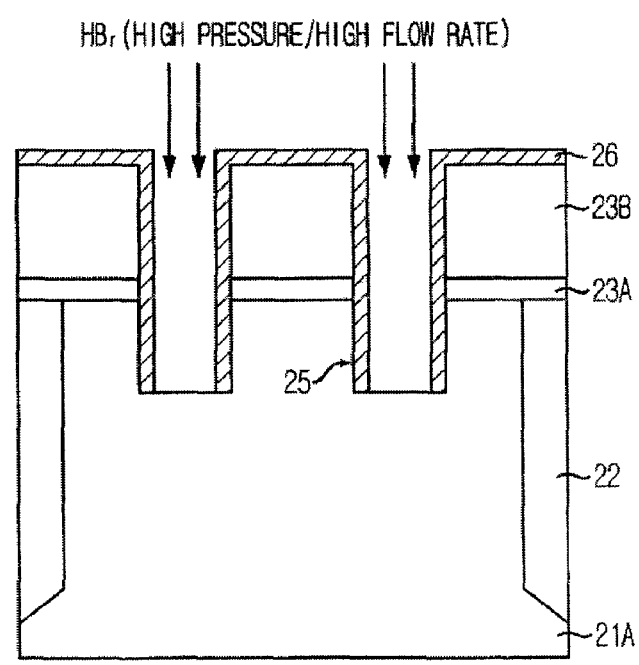

As shown in FIG. 4B, the patterned photoresist layer 24 is removed using oxygen plasma.

Predetermined portions of the substrate 21 are etched using the mask pattern 23 as an etch mask to form a plurality of first recesses 25. The resultant patterned substrate is provided with a reference numeral 21A.

While the first recesses 25 are formed, a polymer-based layer 26 is formed over sidewalls of the first recesses 25, and a top surface of the mask pattern 23.

The polymer-based layer 26 serves as an etch barrier during a subsequent etching process to form a second recess, and the polymer-based layer 26 is formed while the substrate 21 is etched.

In more detail of the formation of the polymer-based layer 26, the substrate 21 is etched to a target depth ranging from approximately 150 Å to approximately 250 Å by using a polymer generating gas. For instance, hydrogen bromide (HBr) gas can be used as the polymer generating gas. The HBr gas is resolved into a bromide (Br) active gas within plasma. As the Br active gas reacts with silicon (Si) in the silicon substrate 21, the substrate 21 is etched, and at the same time the polymer-based layer 26 is formed comprising the product of the reaction between the Br active gas and the silicon in the silicon substrate 21, i.e., silicon tetrabromide ($SiBr_4$).

A high flow rate of the HBr gas ranging from approximately 150 sccm (standard cubic centimeter per minute) to approximately 250 sccm, and a high pressure ranging form approximately 200 mTorr to approximately 300 mTorr are used. As a result, the polymer-based layer 26 comprising $SiBr_4$ is formed over the sidewalls of the first recesses 25 and the top surface of the mask pattern 23.

Consistent with the embodiment of the present invention, the flow rate of the HBr gas and the pressure used in forming the first recesses 25 are greater than those used in conventional methods for forming a recess. Thus, during etching of the substrate 21, a deposition rate of $SiBr_4$ is slower than an etching rate of the substrate 21, as a result of which good property of the polymer-based layer 26 can be achieved. Particularly, the polymer-based layer 26 generated using the high pressure and the HBr gas has a strong bond energy. Thus, the polymer-based layer 26 can serve as an etch barrier during a subsequent etching process to form a second recess to achieve a satisfactory critical dimension of the second recess.

Figure 4C:
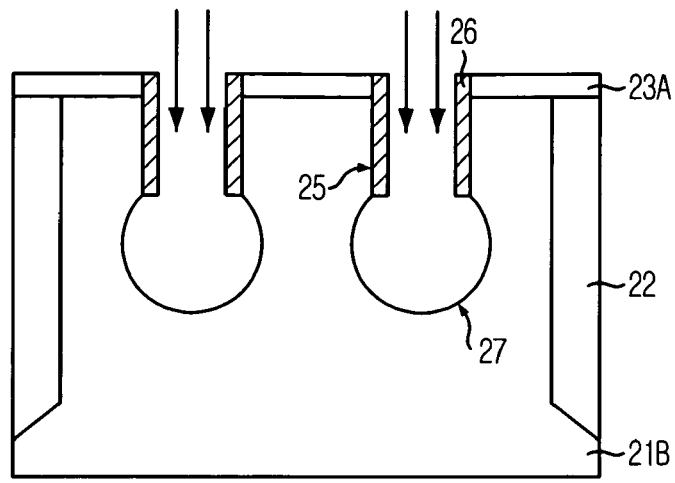

As shown in FIG. 4C, bottom portions of the first recesses 25 are subjected to an isotropic etching process using the polymer-based layer 26 and the mask pattern 23 as an etch mask to form a plurality of second recesses 27. The second recesses 27 are wider and more rounded than the first recesses 25. The resultant, further patterned substrate is denoted with a reference numeral 21B.

The isotropic etching process to form the second recesses 27 is performed through a dry etching process. During the isotropic etching process, a pressure ranges from approximately 250 mTorr to approximately 500 mTorr, and a source power ranges from approximately 1,000 W to approximately 1,500 W without adding a top power. The isotropic etching process uses a fluorocarbon-based gas. For instance, tetrafluoromethane ($CF_4$) or nitrogen trifluoride ($NF_3$) can be used, and a flow rate thereof ranges from approximately 250 sccm to approximately 500 sccm.

When the second recesses 27 are formed, the patterned hard mask layer 23B of the mask pattern 23 is also etched, and predetermined portions of the polymer-based layer 26 formed over the sidewalls of the first recesses 25 and the patterned pad oxide layer 23A remain. Herein, the resultant, patterned polymer-based layer is denoted with a reference numeral 26A.

Recesses including the first recesses 25 and the second recesses 27 are referred to as bulb-shaped recesses. The bulb-shaped recesses have a channel longer than a typical 'U' type recesses.

The second recesses 27 are formed to be wider and more rounded than the first recesses 25. Accordingly, a horn is not formed at edges of the active region contacting the device isolation layers 22.

Figure 4D:
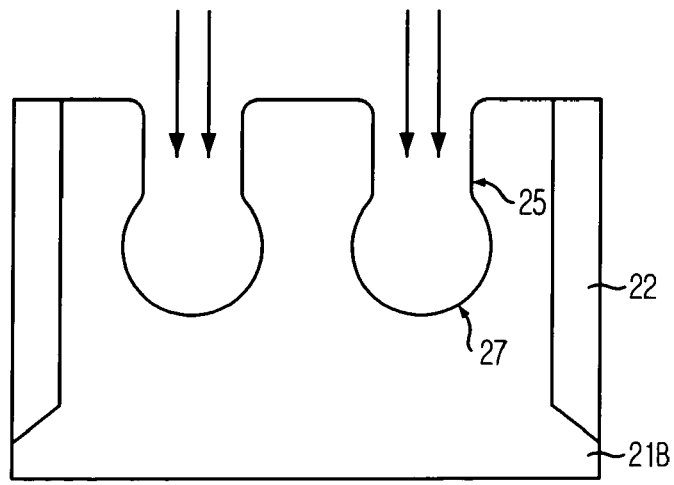

As shown in FIG. 4D, a cleaning process is performed to remove the residues remaining after the etching process, the patterned pad oxide layer 23A, and the patterned polymer-based layer 26A. The cleaning process is performed using one of hydrogen fluoride (HF) solution and buffered oxide etchant (BOE). Through this cleaning process, $SiBr_4$ which forms the polymer-based layer 26 is removed.

A rounding process is performed to round top corners of the recesses 25 and 27. As the rounding process, a light etch treatment (LET) process etching a damaged layer is performed using a mixture gas including $CF_4$ and oxygen ($O_2$). As a result, the top corners of the recesses including the first recesses 25 and the second recesses 27 become rounded. A stress point of a leakage current is removed and a refresh property is improved.

Figure 4E:
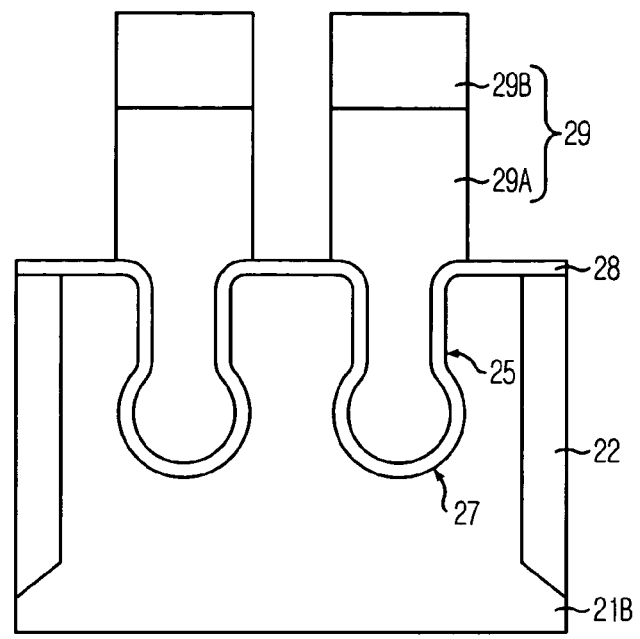

As shown in FIG. 4E, a gate insulation layer 28 is formed over the further patterned substrate 21B provided with the recesses including the first recesses 25 and the second recesses 27.

A plurality of gate patterns 29 are formed over the gate insulation layer 28. First portions of the gate patterns 29 are filled into the recesses including the first recesses 25 and the second recesses 27, and second portions of the gate patterns 29 are projected above the further patterned substrate 21B.

Each of the gate patterns 29 is formed by sequentially stacking a gate electrode 29A and a gate hard mask 29B. The gate electrode 29A is formed with a stack structure of polysilicon and $WSi_x$, and the gate hard mask 29B is formed with silicon nitride ($Si_3N_4$).

Figure 5:
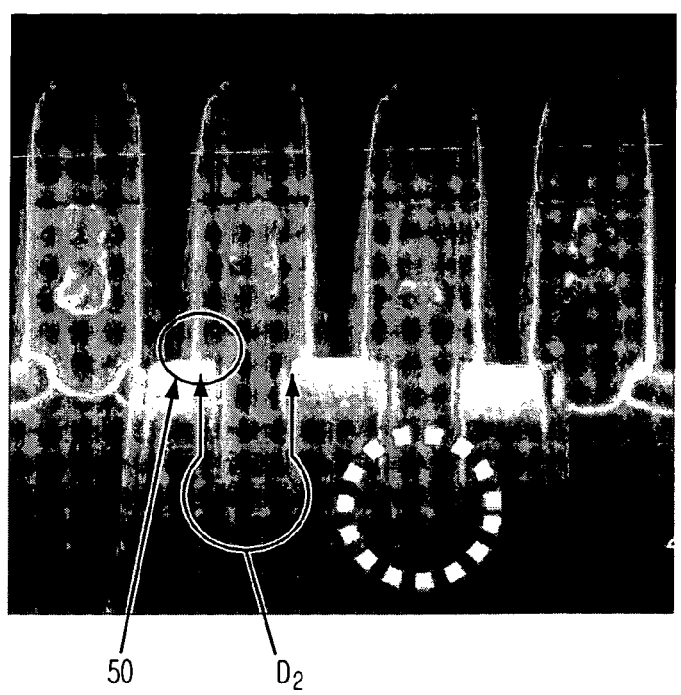
FIG. 5 is a micrographic image of a recess profile of a semiconductor device formed by a method consistent with the embodiment of the present invention.

FIG. 5 is a micrographic image of a recess profile of a semiconductor device formed by the method consistent with the embodiment of the present invention.

Figure 1A:
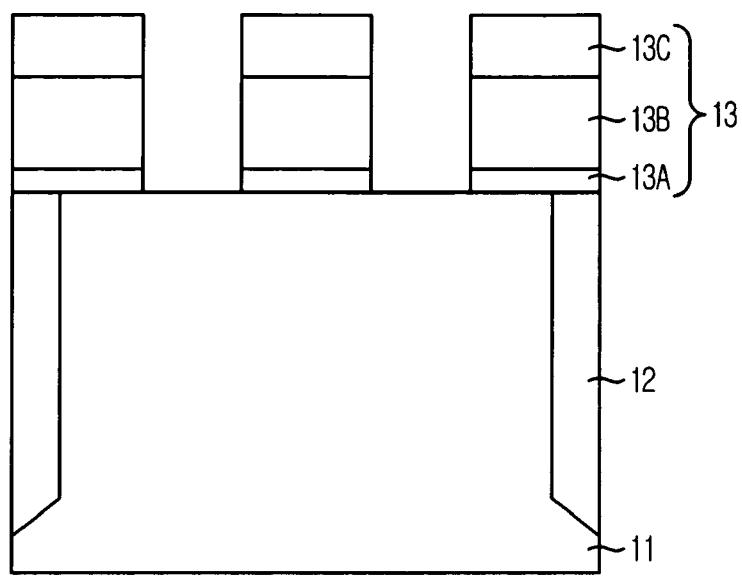
FIGS. 1A and 1B are cross-sectional views illustrating a typical method for fabricating a semiconductor device.
Figure 1B:
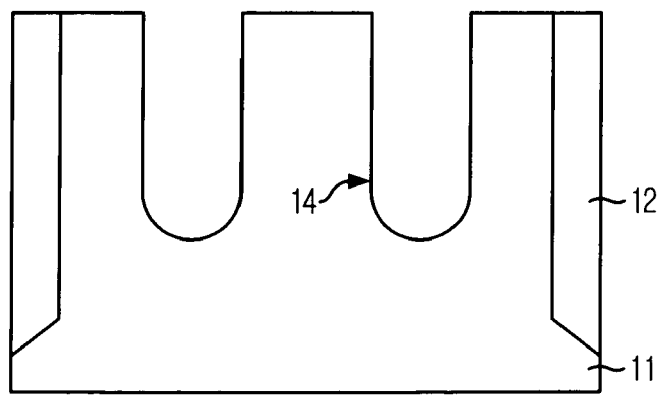
Figure 2:
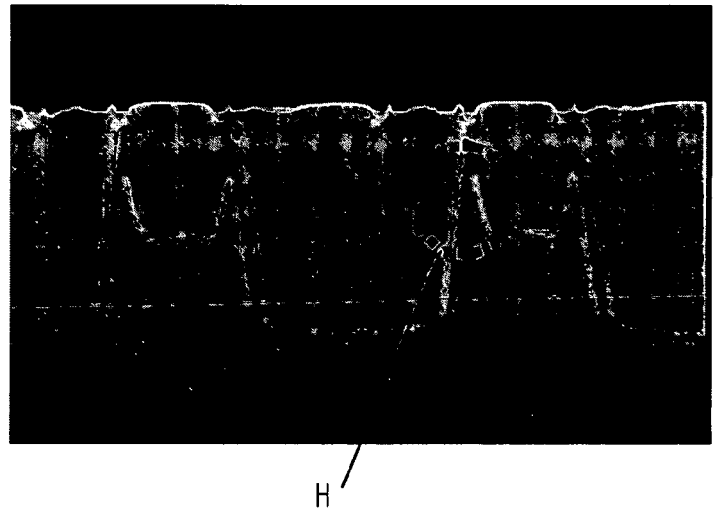
FIG. 2 is a cross-sectional view of a semiconductor device formed by the typical method illustrated in FIGS. 1A and 1B.
Figure 3:
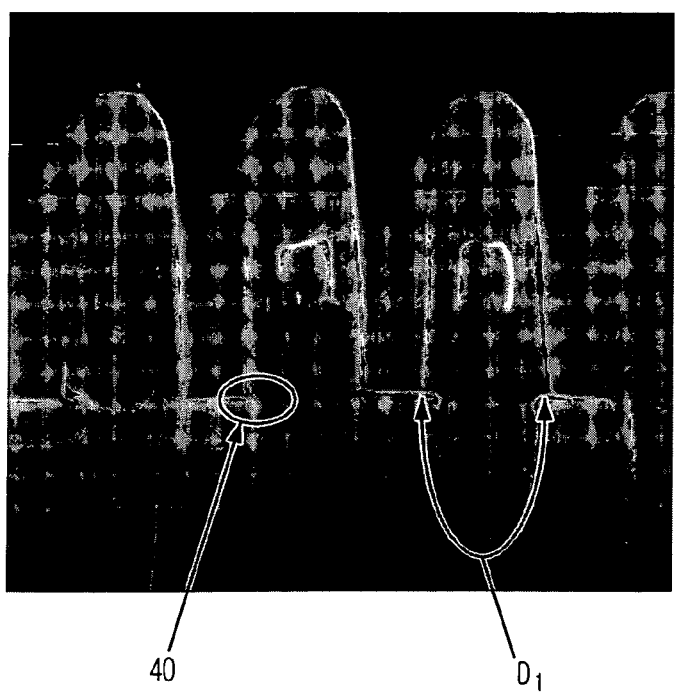
FIG. 3 is a micrographic image of a recess profile of a semiconductor device formed by the typical method illustrated in FIGS. 1A and 1B.

As shown in FIG. 5, a bulb-shaped recess consistent with the embodiment of the present invention has a channel length of $D_2$, longer than the channel length $D_1$ as shown in FIG. 3, and a top corner 50 of the bulb-shaped recess is rounded, as a result of which the stress point 40 shown in FIG. 3 does not exist in the bulb-shaped recess consistent with the embodiment of the present invention.

Consistent with the embodiment of the present invention, a bulb-shaped recess increases a channel length. A horn and a stress point of top corners of the bulb-shaped recess are removed by performing a rounding process. Accordingly, a leakage current can be prevented. Also, consistent with the embodiment of the present invention, the increased channel length increases a threshold voltage. Accordingly, a breakdown voltage can be improved, and a refresh property is improved by the rounding process.

While the present invention has been described with respect to certain embodiments, it will be apparent to those skilled in the art that various changes and modifications may be made without departing from the spirit and scope of the invention as defined in the following claims.

What is claimed is:

1. A method for fabricating a semiconductor device, comprising:
    forming a mask pattern over a substrate;
    etching a certain portion of the substrate using the mask pattern as an etch mask to form a first recess having sidewalls;
    forming a polymer-based layer over the sidewalls of the first recess and a top surface of the mask pattern, wherein the polymer-based layer is formed at the same time when the substrate is etched to form the first recess;
    etching the substrate beneath the first recess using the mask pattern and the polymer-based layer as an etch mask to form a second recess wider and more rounded than the first recess, the second recess and the first recess constituting a bulb-shaped recess;
    rounding top corners of the bulb-shaped recess; and
    forming a gate pattern over the bulb-shaped recess.

2. The method of claim 1, wherein forming the first recess comprises etching the substrate using a polymer generating gas.

3. The method of claim 2, wherein forming the first recess comprises providing a hydrogen bromide (HBr) gas with a flow rate ranging from approximately 150 sccm to approximately 250 sccm.

4. The method of claim 2, wherein forming the first recess comprises proceeding at a pressure ranging from approximately 200 mTorr to approximately 300 mTorr.

5. The method of claim 2, wherein forming the first recess comprises etching the substrate to a depth ranging from approximately 150 Å to approximately 250 Å.

6. The method of claim 1, wherein forming the second recess comprises performing a dry isotropic etching process.

7. The method of claim 6, wherein forming the second recess comprises performing the dry isotropic etching process with a pressure ranging from approximately 250 mTorr to approximately 500 mTorr.

8. The method of claim 6, wherein the forming the second recess comprises performing the dry isotropic etching process with a source power ranging from approximately 1,000 W to approximately 1,500 W.

9. The method of claim 6, wherein forming the second recess comprises performing the dry isotropic etching process using a fluorocarbon-based gas.

10. The method of claim 9, wherein the fluorocarbon-based gas is one of tetrafluoromethane ($CF_4$) and nitrogen trifluoride ($NF_3$).

11. The method of claim 9, wherein the dry isotropic etching process uses the fluorocarbon-based gas with a flow rate ranging from approximately 250 sccm to approximately 500 sccm.

12. The method of claim 1, wherein forming the mask pattern comprises forming a pad oxide layer and a polysilicon-based hard mask.

13. The method of claim 1, wherein the forming of the gate pattern comprises:
    performing a cleaning process removing the mask pattern and the polymer-based layer;
    forming a gate insulation layer over the bulb-shaped recess; and
    forming a gate pattern having a first portion filled into the bulb-shaped recess and a second portion projected above the patterned substrate over the gate insulation layer.

14. The method of claim 13, wherein rounding the top corners of the bulb-shaped recess uses a mixture gas including tetrafluoromethane ($CF_4$) and oxygen ($O_2$).

15. The method of claim 14, wherein performing the cleaning process uses one of hydrogen fluoride (HF) solution and buffered oxide etchant (BOE).

* * * * *